United States Patent
Bouchard et al.

(10) Patent No.: US 9,985,156 B2
(45) Date of Patent: May 29, 2018

(54) OPTICAL CONCENTRATOR/DIFFUSER USING GRADED INDEX WAVEGUIDE

(71) Applicant: Université Laval, Quebec (CA)

(72) Inventors: Sébastien Bouchard, Quebec (CA); Simon Thibault, Quebec (CA)

(*) Notice: Subject to any disclaimer, the term of this patent is extended or adjusted under 35 U.S.C. 154(b) by 225 days.

(21) Appl. No.: 15/032,897

(22) PCT Filed: Oct. 31, 2014

(86) PCT No.: PCT/CA2014/051048
§ 371 (c)(1),
(2) Date: Apr. 28, 2016

(87) PCT Pub. No.: WO2015/061909
PCT Pub. Date: May 7, 2015

(65) Prior Publication Data
US 2016/0284910 A1    Sep. 29, 2016

Related U.S. Application Data

(60) Provisional application No. 61/898,759, filed on Nov. 1, 2013.

(51) Int. Cl.
*H01L 31/054* (2014.01)
*G02B 5/02* (2006.01)
(Continued)

(52) U.S. Cl.
CPC ........ *H01L 31/0543* (2014.12); *G02B 5/0294* (2013.01); *G02B 6/26* (2013.01);
(Continued)

(58) Field of Classification Search
CPC combination set(s) only.
See application file for complete search history.

(56) References Cited

U.S. PATENT DOCUMENTS

| | | | | |
|---|---|---|---|---|
| 4,082,415 A | * | 4/1978 | Brooks | ..... G02B 5/32 359/20 |
| 5,694,218 A | * | 12/1997 | Fukui | ..... G01D 5/38 250/237 G |

(Continued)

FOREIGN PATENT DOCUMENTS

JP    2013015304 A    *    1/2013    ............. G02B 7/183

OTHER PUBLICATIONS

JP-2013015304-A, Mitsunari, Toshiyasu, English equivalent of the abstract (Year: 2013).*

(Continued)

*Primary Examiner* — Susan D Leong
(74) *Attorney, Agent, or Firm* — Benoit-Côté Inc.

(57) ABSTRACT

An optical concentration/diffusion apparatus and method is provided that uses a waveguide having a graded index of refraction in a first direction. Light propagating in a second direction different from the first direction follows a curved, path being reflected at multiple intervals by a planar interface of the waveguide. Reflectors are located along the planar interface at a spacing that is selected to limit their interaction with the light propagating in the second direction. Coupling elements are located in optical communication with the reflectors. When used as a concentrator, light is focused by the elements onto the reflectors and redirected in the second direction towards one or more exit apertures. When used as a diffuser, light in the second direction is redirected by the reflectors toward the elements and diffused at multiple exit apertures.

26 Claims, 6 Drawing Sheets

(51) Int. Cl.
*G02B 19/00* (2006.01)
*G02B 6/26* (2006.01)

(52) U.S. Cl.
CPC ..... *G02B 19/0028* (2013.01); *G02B 19/0042* (2013.01); *H01L 31/0547* (2014.12); *Y02E 10/52* (2013.01)

(56) References Cited

U.S. PATENT DOCUMENTS

| | | |
|---|---|---|
| 7,391,939 B1 | 6/2008 | Williams |
| 2002/0076157 A1 | 6/2002 | Kropp |
| 2004/0252943 A1* | 12/2004 | Schilling .................. G02B 6/34 385/37 |
| 2010/0037954 A1 | 2/2010 | Thony |
| 2010/0116319 A1 | 5/2010 | Martinez Anton et al. |
| 2011/0007320 A1* | 1/2011 | Krauss ...................... G01J 1/08 356/446 |
| 2011/0217013 A1 | 9/2011 | Moore et al. |
| 2012/0099325 A1 | 4/2012 | Ghosh et al. |
| 2013/0028565 A1* | 1/2013 | Moore ................ H01L 31/0547 385/129 |

OTHER PUBLICATIONS

Bouchard et al., GRIN planar waveguide concentrator used with a single axis tracker, Optics Express, Jan. 23, 2014, vol. 22, No. S2.
Saleh et al., Fundamentals of Photonics, John Wiley and Sons, Inc., 1991, pp. 272-309.

* cited by examiner

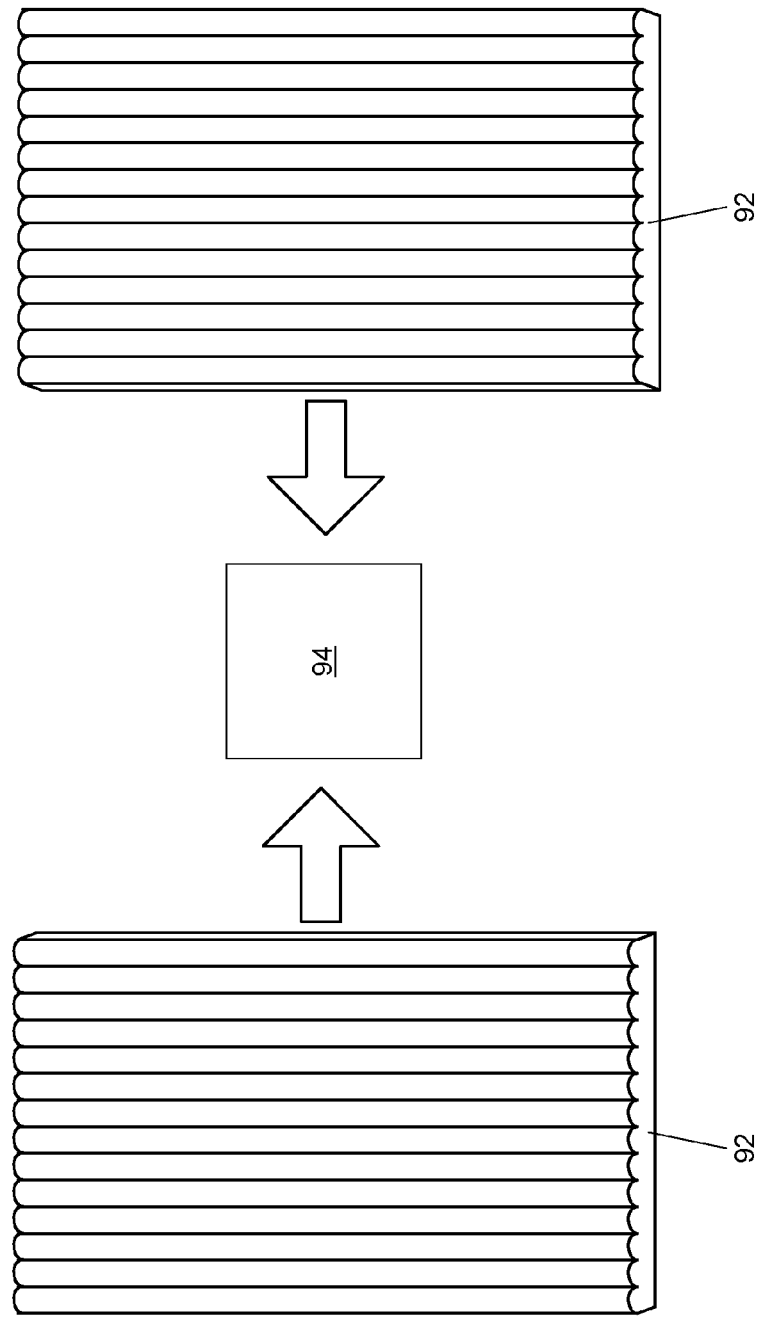

OPTICAL CONCENTRATOR/DIFFUSER USING GRADED INDEX WAVEGUIDE

BACKGROUND OF THE INVENTION

Field of the Invention

This invention relates generally to the field of optical concentration and diffusion, such as solar concentration in solar energy systems, and more specifically to waveguide-based optical concentration/diffusion systems.

Description of the Related Art

In solar energy systems, solar concentration is a way to reduce the overall photovoltaic (PV) surface area that is necessary to produce a given amount of energy. The general principle of solar concentration is the collection of light over a relatively large surface area and transmitting it to a comparatively smaller PV surface. Assuming that the optical system is cheaper than a PV cell having the larger surface area, the reduction in size of the PV surface allows the use of cells having higher efficiencies without increasing cost.

In a solar concentrator, the ratio between the size of the entrance aperture and the size of the exit aperture is referred to as the geometric concentration factor C, while the ratio between the total optical energy reaching the exit aperture relative to that which is incident on the entrance aperture is called the optical efficiency. In practice, the concentration factor is limited by the field of view (FOV) of the optical system. Thus, if $\varphi$ is the FOV (i.e., the acceptance angle) of the solar concentrator, the maximum concentration factor $C_{max}$ is given by the following equation:

$$C_{max} = \frac{n^2}{\sin^2\varphi}$$

where n is the index of refraction of the medium into which the light is coupled.

Many of the disadvantages of existing solar concentrators are related to the limitation imposed by the FOV of the system. Planar systems like fluorescent concentrators tend to not be very efficient, and then can only attain small concentration factors. Static imaging or non-imaging concentrators can also be used. Since they are stationary while the sun changes position, they cannot capture much of the incoming solar energy during the year. Indeed, from the foregoing equation, it is evident that a stationary solar concentrator will have a FOV restricted to certain parts of the sky and that, to increase C, the concentrator would have to be installed on a sun tracker.

Sun trackers are known in the art, and work by changing the orientation of a solar collector to increase the overall time during which incoming sunlight remains within its FOV. Two general types of sun trackers are "single-axis" systems, which have movement along one axis of rotation, and "dual-axis" systems, which have two perpendicular axes of rotation. Single-axis tracking systems collect much more light than static systems and reach a higher concentration factor. Dual-axis tracking systems collect more light annually than single-axis systems, and reach an even higher concentration factor, but are more costly to implement. Such systems also require heavy, two-axis motorized trackers that cannot be installed in many locations.

One of the known types of solar concentrator available is a waveguide solar concentrator (WSC). A conventional WSC is shown schematically in FIG. 1. The WSC shown in the figure uses a light focusing element 12, such as an objective lens, and focuses it to a focal point within a waveguide 14, which is separated from the focusing element 12 by air or by any material having a different refractive index compared to the waveguide. Located at the focal point is a reflective component 16 that redirects light received from the focusing element within the waveguide at an angle that results in total internal reflection (TIR) of the light within the waveguide. The light thereby collected then travels along the waveguide and finally exits at an end having a relatively small area, and is incident upon an appropriate PV element.

In a typical configuration, a plurality of focusing elements 12 are provided along a top of the concentrator, each having a focal point at a different reflective component 16. The reflective components all redirect the collected light in the same direction along the waveguide such that the overall light energy exiting the end of the waveguide is increased. However, due the presence of many of the reflective elements, undesired reflections of light propagating within the waveguide may result, causing light previously undergoing TIR to be redirected at an angle that allows it to escape from the waveguide.

The reflective components 16 of the waveguide may take different forms. Typically, a structure such as a grating, or a convex or concave prism is used to redirect light in the desired direction. These structures are effective at coupling light into the waveguide but, as mentioned above, losses arise due to the interaction of light rays in the waveguide with these structures, which results in unintended reflections.

A WSC using cylindrical lenses as focusing elements is of interest because it is lightweight and compact, relatively inexpensive to fabricate, and because it can function with only one axis of sun tracking. However, because of rays lost during propagation within the waveguide, the optical efficiency is comparatively low for a given waveguide length. Moreover, there is a reduced optical efficiency due to Fresnel reflections at various air/material interfaces along the light path, such as surfaces 17 and 18 shown in FIG. 1. Finally, the relative alignment of focusing elements 12 and waveguide 14 requires supplemental manufacturing steps to ensure that the reflective elements 16 are positioned at the focal point of their corresponding focusing elements 12.

SUMMARY OF THE INVENTION

In accordance with the present invention, an optical concentration/diffusion apparatus and method is provided that uses a waveguide into which light is coupled. The waveguide uses a material that has a graded index in a first direction that causes light propagating in the waveguide along a second direction different from the first direction to follow a curved path. Along this path, the light is reflected at multiple intervals by a planar interface of the waveguide. Located along the planar interface are a plurality of reflectors that receive light coupled into the waveguide and redirect it towards at least one exit aperture. In the context of the invention, a reflector may be any element that redirects light in the desired direction or directions, such as a mirror, a prism, a diffractive optical element (such as a grating) or the like. The reflectors have a spacing along the second direction that may or may not be regular, and that is selected to limit interaction between the reflectors and the light propagating along the second direction. The apparatus may also include a number of coupling elements each of which is in optical communication with one of the reflectors, and each of which provides either focusing or diffusion of light that it receives, depending on the specific application. The waveguide may also have a tapered width in a direction perpendicular to the second direction.

When the apparatus is used as an optical concentrator, the coupling elements are used in a convergent capacity, and each focuses light onto one of the reflectors. The reflectors each redirect the light received such that it propagates along the second direction of the waveguide so as to provide concentration of the light at a single exit aperture. In contrast, when the apparatus is used as an optical diffuser, the light coupled into the waveguide propagates along the second direction and is redirected by the reflectors toward the coupling elements, which are used in a diffusing capacity to provide diffusion of the light at a plurality of exit apertures.

The apparatus and method of the present invention may have different specific design characteristics. For example, the coupling elements may be an integral part of the waveguide material, or they may be separate, discrete components. In one embodiment, the coupling elements may be lenses, either conventional or Fresnel lenses, that are either cylindrical or rotationally symmetric. In another embodiment, the coupling elements may be curved mirrors. In yet another embodiment, the coupling elements may be surface irregularities in an interface of the waveguide that provide diffusion of light redirected by the reflectors as it exits the waveguide. The reflectors may also be of different types, including prisms or gratings. In one particular embodiment, the apparatus is used as a solar concentrator, and at least one photovoltaic cell is located adjacent to the exit aperture of the apparatus.

BRIEF DESCRIPTION OF THE DRAWINGS

FIG. 9 is a schematic view of a concentrator embodiment of the invention that uses two waveguides each having an exit aperture directed to the same energy collector.

DETAILED DESCRIPTION

Figure 1:
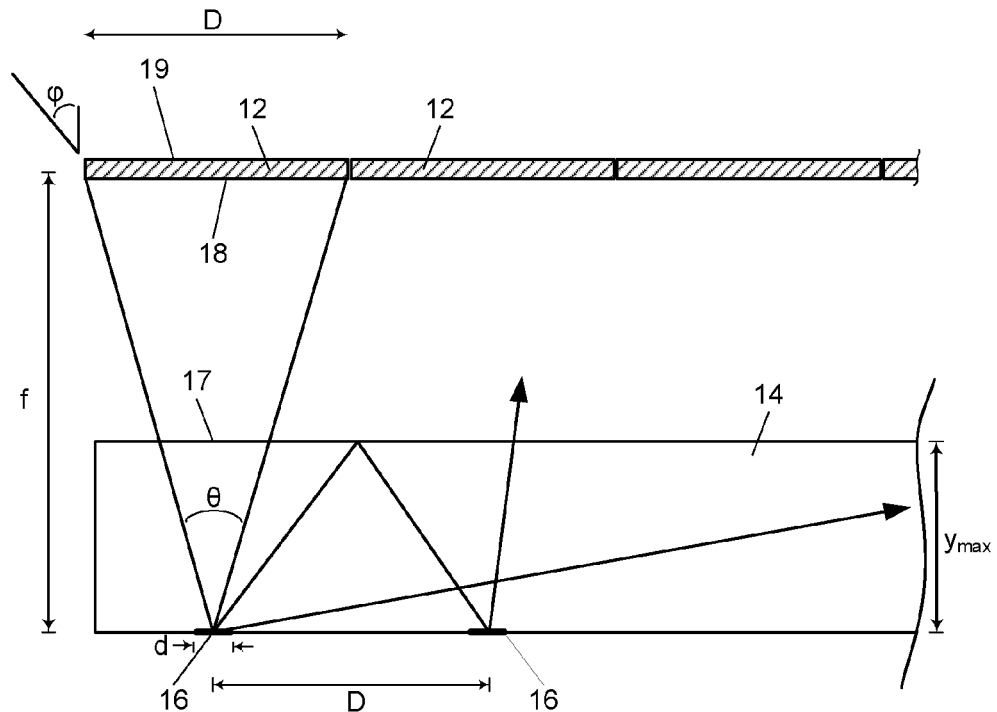
FIG. 1 is a schematic view of a waveguide solar concentrator according to the prior art.
Figure 2:
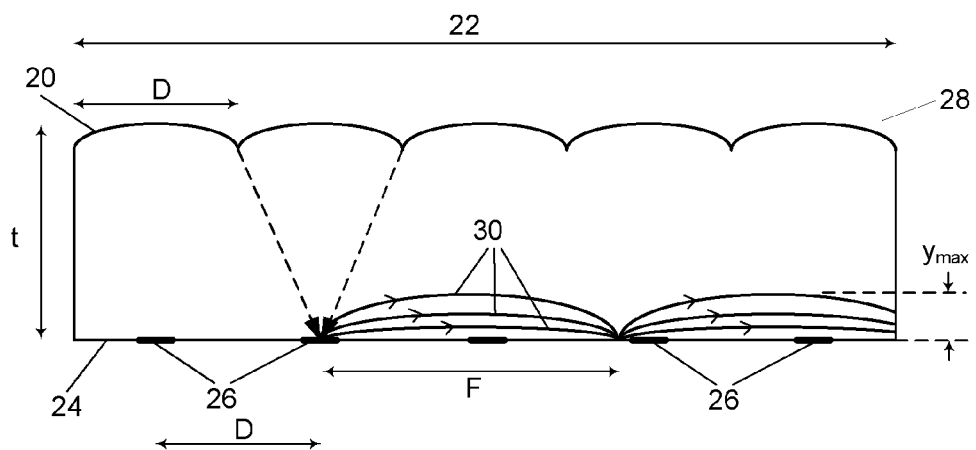
FIG. 2 is a schematic view of an exemplary embodiment of an optical concentrator/diffuser according to the present invention.

Shown in FIG. 2 is a schematic view of a first embodiment of an optical concentrator/diffuser according to the present invention. This embodiment is may be used as a waveguide solar concentrator (WSC) in a manner similar to WSCs of the prior art. A repeating pattern along an upper surface 20 of the WSC extends for the length of the entrance aperture 22 of the WSC and is structured to receive solar radiation and to direct it toward a number of reflectors 26 located along a lower surface 24 of the WSC. In particular, the pattern on surface 20 may act as a series of lenses, each of which focuses light within its range of acceptance toward a different one of the reflectors 26, as indicated in the figure. The light transmitted through the WSC is reflected by the reflectors 26 toward a lateral side of the WSC, propagating in the WSC until it reaches an exit aperture in the side surface 28 of the waveguide.

Figure 3:
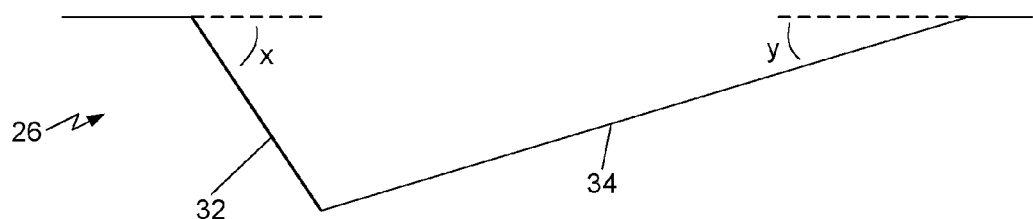
FIG. 3 is a schematic view of the geometry of a reflector used with an optical concentrator/diffuser like that of FIG. 2.

FIG. 3 is an isolated, cross-sectional view of one of the reflectors 26 used with the present embodiment of the invention. A first reflective interface 32 of the reflector has an angle x of approximately 40° relative to the otherwise flat surface 24 of the waveguide, although those skilled in the art will recognize that the angle x will generally be chosen relative to the other parameters of the system. The focal point for light from a focusing element on the upper surface of the waveguide is centered on the interface 32, thus maximizing the coupling into the waveguide in the desired direction. To increase the reflection coefficient, interface 32 is preferably metalized. The interface 34 has an angle $y \cong 10°$ relative to the surface 24 that is much shallower than angle x so as to minimize interference with the light reflected by interface 32. Thus the geometry of the reflector in FIG. 3 is asymmetric, and it redirects all light towards the same exit aperture. However, it is also possible to use a structure with symmetric reflecting surfaces, for which angles x and y would be equal. In such an embodiment both surfaces would provide a desired reflection of the light, which would travel in two opposite directions and escape the waveguide through at least two exit apertures.

In the embodiment of FIG. 2, the WSC consists of a planar waveguide with a refractive index that varies from the surface 20 to the surface 24, that is, it has a graded index of refraction. The specific index gradient depends on the system design, as is discussed in more detail below. However, one advantage of using such a material can be understood by recognizing that light propagating in the waveguide may be lost when it encounters one of the reflectors 26. By better controlling the propagation of the light within the waveguide and, in particular, the positions along the waveguide at which the light is refocused by the graded index material, these interactions can be eliminated or at least minimized and the loss thereby reduced. Moreover, the path of light rays propagating in the waveguide in a direction perpendicular to the direction of the gradient will be confined to the higher refractive index region of the waveguide, and will therefore not undergo internal reflection at the surface 20 of the waveguide, as is the case with prior art WSC designs. As such, there is no need for a planar interface at the surface 20 to provide internal reflection, and this surface may therefore be patterned with integral optical structures, such as lenses or other shapes. Since these structures are integral with the waveguide material, coupling losses that exist in systems having separate components adjacent to the waveguide surface are avoided.

In an ideal system having the configuration of FIG. 2, where the focusing elements on the surface 20 are cylindrical lenses, and assuming an angular diameter of the sun of 0.52° (i.e., ±0.26°) each of the lenses may be determined to have the following concentration factor:

$$C_{lens} = \frac{D}{d} \approx \frac{D}{2fn_0\tan\varphi} \approx \frac{110}{F/\#}$$

where the lens has a width D and a focal length f, d is the width of the reflector surface, φ is the angular acceptance angle of the optical system, F/# is the f-number equal to f/D, and $n_0$ is the refractive index at the base of the waveguide, i.e., opposite the lens array 20. In the present embodiment, the parameter F of the graded index waveguide is chosen so as to maximize the propagation length before a ray strikes a second reflector.

Rays propagating through a conventional graded index waveguide have a sinusoidal trajectory. As mentioned above, for a waveguide like that shown in FIG. 2, this means that the light rays do not reach the upper surface 20 of the waveguide. However, since the waveguide is a planar waveguide, the rays will follow the equivalent of a "rectified" sinusoidal path, as they continue to be internally reflected by the surface 24, which is in the high-index region of the waveguide structure. An example of these trajectories is shown in FIG. 2 at reference numeral 30. To avoid the rays immediately encountering another reflector once the light is reflected in into the waveguide, the period of the graded index material is selected to be different than the spacing D between the reflectors. Those skilled in the art will understand that this differential between the reflector spacing and the graded index material period is cumulative, such that the relative position between a focal point within the waveguide and the nearest reflector will continue to change as the light propagates along the waveguide. However, the period of the sinusoidal trajectories of the rays may nonetheless be selected to minimize these interactions.

In the present embodiment, the period F is chosen to be:

$$F = MD \pm \kappa d$$

where $1 < \kappa < D/d$, and M is an integer larger or equal to 1. The size of the lens dictates that $\kappa < D/d$, while $\kappa > 1$ in order to eliminate shadowing. Those skilled in the art will understand that if κ is not greater than one, the bundle of rays coupled into the waveguide will partially overlap with the next prism, which would reduce the optical efficiency for each lens coupled into the waveguide. In the present embodiment, M=1. The maximum number of lenses 20 N to avoid loss in the waveguide is then given by:

$$N = \frac{F}{\kappa d} = \frac{D \pm \kappa d}{\kappa d} = \frac{C_{lens}}{\kappa} \pm 1$$

As such, it can be seen that the number of lenses is directly related to the concentration factor of the lens.

Given this value for the maximum number of interactions with the surface 24 without striking a second prism structure, the concentration factor of the planar waveguide can be calculated. This maximum concentration factor is only related to the length of the waveguide L and the effective thickness $y_{max}$ of the waveguide. The length may be determined from the number of lenses N multiplied by the lens diameter D as follows:

$$L = ND = D\left(\frac{C_{lens}}{\kappa} \pm 1\right)$$

The maximum concentration factor can then be calculated simply by dividing the length of the waveguide L by the effective thickness $y_{max}$. This leads to the following expression, in which β is used to represent losses associated with Fresnel reflections and absorption in the waveguide material.

$$C = \beta \frac{D\left(\frac{C_{lens}}{\kappa} \pm 1\right)}{y_{max}}$$

The present embodiment makes use of a parabolic index profile which approximates the exact gradient index profile. The exact index profile for all rays to be re-imaged at the same distance along the waveguide is a hyperbolic secant index profile. It can also be any index profile that re-images a point periodically or almost periodically along the waveguide. This approximation allows for an evaluation of $y_{max}$. The parabolic index profile of the waveguide may be described as:

$$n(y) = n_0(1 - Ay^2)^{1/2}$$

For $0 < y < y_{max}$ $$n(y) = n_g$$

For $y_{max} < y < t$

Where $n_g$ is the lower index of refraction of the waveguide and t is the actual thickness of the waveguide. The parameter A may be defined as $$A = \frac{(n_0^2 - n_{y_{max}}^2)}{n_0^2 y_{max}^2}$$

and $y_{max}$ can be defined as $$y_{max} = n_{y_{max}} \sin\theta / n_0 \sqrt{A}$$

Thus, it may be seen that the effective thickness $y_{max}$ of the waveguide is a balance between two parameters. The index constant A represents the index variation inside the material. If the acceptance angle θ is increased, it will be necessary to increase the index variation as well in order to keep a constant waveguide thickness.

The foregoing equations demonstrate that the modification of the f-number will directly affect $C_{lens}$ and the angle θ. It is desirable to fill the waveguide with light across its entire thickness so as to maximize the number of modes coupled in the waveguide. As such, the present embodiment uses optics with the lowest possible effective f-number to couple light into the waveguide. However, this leads to an increase in the concentration factor of the system. Since the focal spot is located at the base of the waveguide where the index of the material is $n_0$, a balance must be drawn between using fast lenses (with an f-number of 2.5 or lower) and providing sufficient thickness for mechanical stability.

Figure 4:
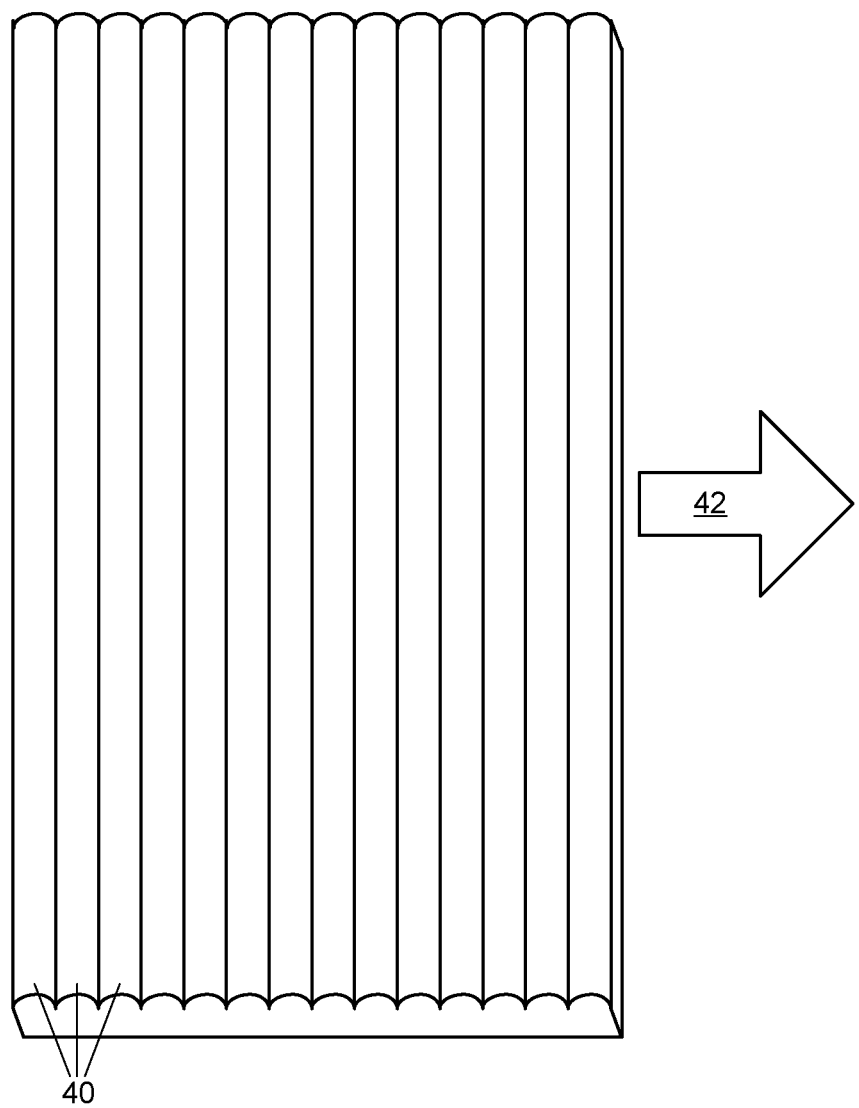
FIG. 4 is a schematic perspective view of an external surface of an optical concentrator/diffuser according to the present invention that is structured as cylindrical lenses.

FIG. 4 is a schematic perspective view of a first embodiment of a waveguide according to the present invention. In this embodiment, the upper surface of the waveguide is patterned to form a series of parallel cylindrical lenses 40. Each of the lenses 40 is positioned above an elongate reflector (not shown) that extends the length of the waveguide, and focuses light as a line at the location of its corresponding reflector. Each reflector is positioned below one of the lenses and has a cross section like that shown in FIG. 3. The focal line produced by a lens is incident on the reflecting surface 32 of its corresponding reflector such that the light is redirected within the waveguide in a direction perpendicular to the longitudinal direction of the lenses. The light from each of the reflectors combines within the waveguide, eventually exiting the waveguide in the direction indicated by the arrow 42 shown in FIG. 4, where it is collected by any known means.

Figure 5:
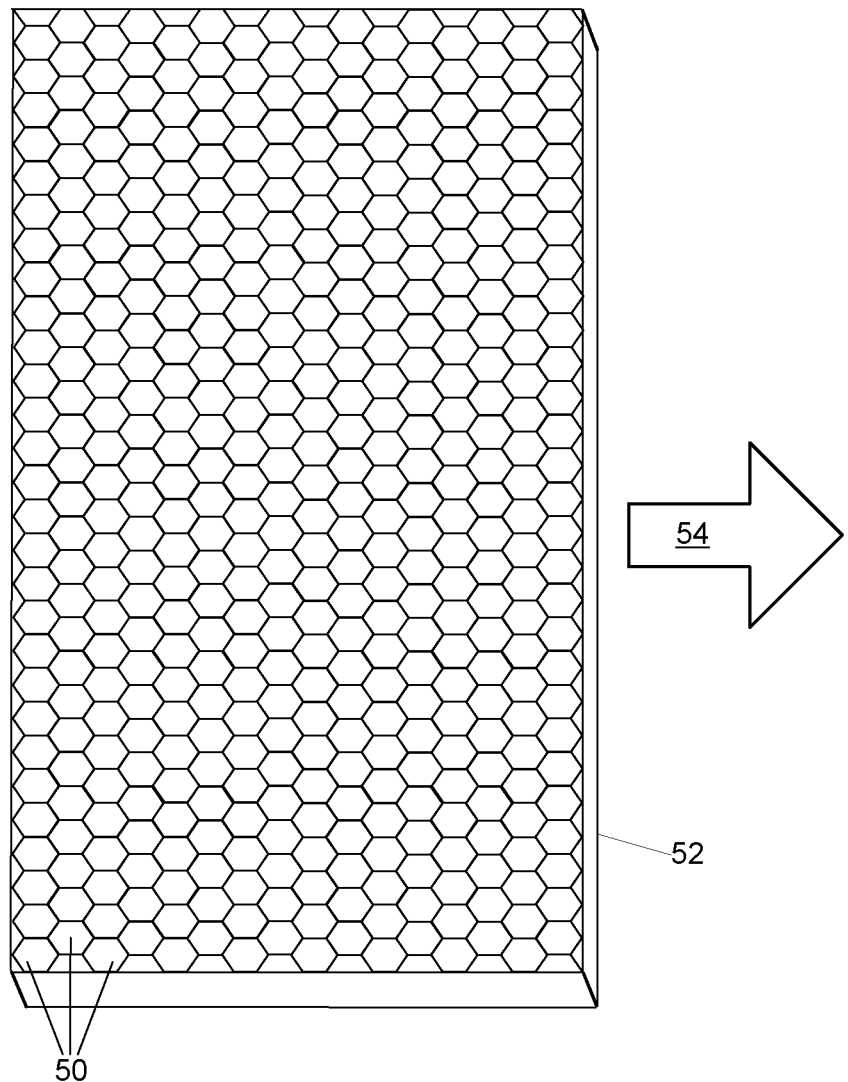
FIG. 5 is a schematic perspective view of an external surface of an optical concentrator/diffuser according to the present invention that is structured as rotationally symmetric lenses.

In an alternative embodiment, shown in FIG. 5, the waveguide consists of an array of rotationally symmetric lenses 50 that are preferably patterned in the waveguide upper surface. In this embodiment, the lenses have a hexagonal shape that allows for an efficient use of the upper surface area. However, those skilled in the art will understand that these lenses could also have a different shape (e.g., circular). Unlike the embodiment of FIG. 4, the lenses in this embodiment each image the light they receive to a point that is focused on a reflector located along a base of the waveguide. Each of the reflectors has a cross section like that shown in FIG. 3, and redirects light toward the side 52 of the waveguide, where it exits in the direction indicated by the arrow 54 and is collected by any known means. The reflectors are aligned with the lenses 50 such that the light focused by the lenses is incident on the reflective surface 32 (FIG. 3) to be redirected within the waveguide in the indicated direction. In one variation of the FIG. 5 embodiment, the reflectors (not shown) are elongate running perpendicular to the direction of light travel, such that each reflector receives light from an entire row of lenses 50. In a different version of this embodiment, each reflector may be an individual reflector that corresponds to just one lens 50, that is, one reflector is provided for each lens.

Figure 6:
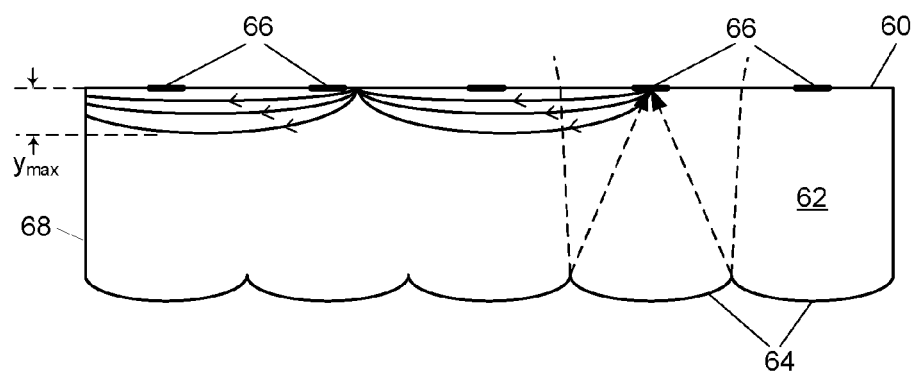
FIG. 6 is a schematic view of an alternate embodiment of a waveguide solar concentrator according to the present invention.

Another alternative embodiment of the invention is shown in FIG. 6. In this arrangement, the focusing of light to the reflectors comes not from lens structures on the surface, but from mirrors at the opposite side of the waveguide structure. Light directed to the surface 60 of the graded index waveguide 62 is refracted within the waveguide material and eventually encounters one of a series of mirrors 64. Each of these mirrors is concave and is shaped in accordance with the refractive index of the material so as to focus the reflected light onto one of a series of reflectors 66 positioned along the inside of surface 60. The reflectors 66 are of the same design as that shown in FIG. 3, and redirect the light from mirrors 64 in a transverse direction through the graded index material. As in the embodiment of FIG. 2, the graded index of the material prevents interaction of light propagating in the waveguide with the mirror structures, which may be an integral part of the waveguide material. Once reflected, the light will also follow an oscillation path that avoids subsequent interaction with the other reflectors 66, as is the case in the FIG. 2 embodiment. The light then exits the side 68 of the waveguide where it may be collected.

Figure 7:
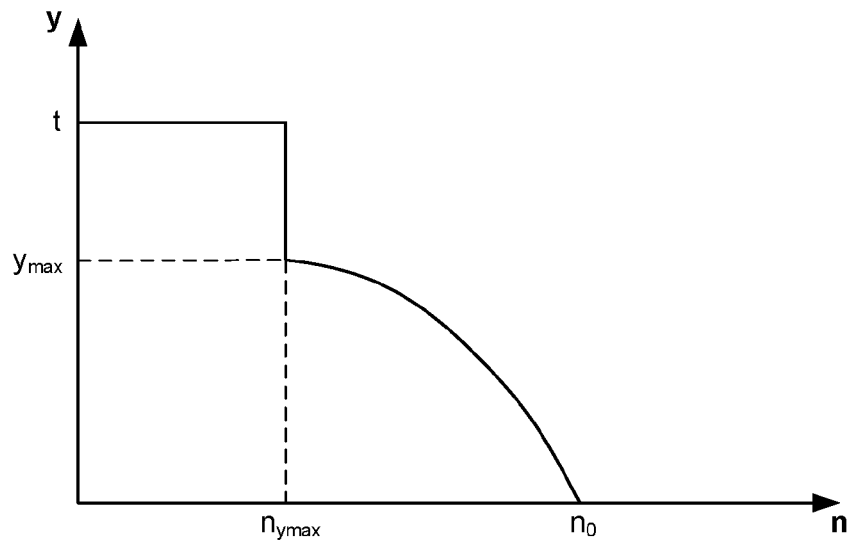
FIG. 7 is a graphical view of the index profile of a waveguide according to an exemplary embodiment of the invention.

The structures described above are presented as efficient light concentrators. However, each of these structures may also be used in an inverted manner as part of an illumination system. In such an application, light is injected into the waveguide from the side of the material that would be the exit point for the light if it was being used as a light concentrator. Thus, for the embodiment of FIG. 2, light would be injected into the side 28 of the waveguide whereas, for the embodiment of FIG. 6, light would be injected into the side 68. The light so coupled into the waveguide follows the opposite path as it would in the concentrator embodiments, traveling according to the periodicity of the graded index material. Ultimately, the light will encounter the reflectors and be reflected out of the waveguide. Because different rays in the waveguide will encounter different reflectors, and since the focusing elements (i.e., the lens structures 20 in the embodiment of FIG. 2, or the mirrors 64 in the embodiment of FIG. 4) have a diffusing effect on the light they redirect, the light exiting the waveguide will be effectively homogenized along the length of the structure. FIG. 7 is a graph of the index profile of a waveguide according to an exemplary embodiment of the invention. For a structure like that shown in FIG. 2, rays 30 travel towards the exit aperture while remaining in the region with the parabolic index gradient, the top of which is identified as $y_{max}$. As shown in FIG. 7, above this region, the refractive index is constant from the upper surface of the waveguide to position $y_{max}$, at which the index equals $n_{ymax}$. It then increases from $n_{ymax}$ to $n_0$ at the base of the waveguide (e.g., surface 24 in the embodiment of FIG. 2), following the parabolic curve shown in FIG. 7. In the embodiment for which the reflector is a convex prism, the zone of index variation may also be from $n_{ymax}$ at $t=y_{max}$ to $n_0$ at the tip of the prism.

Figure 8:
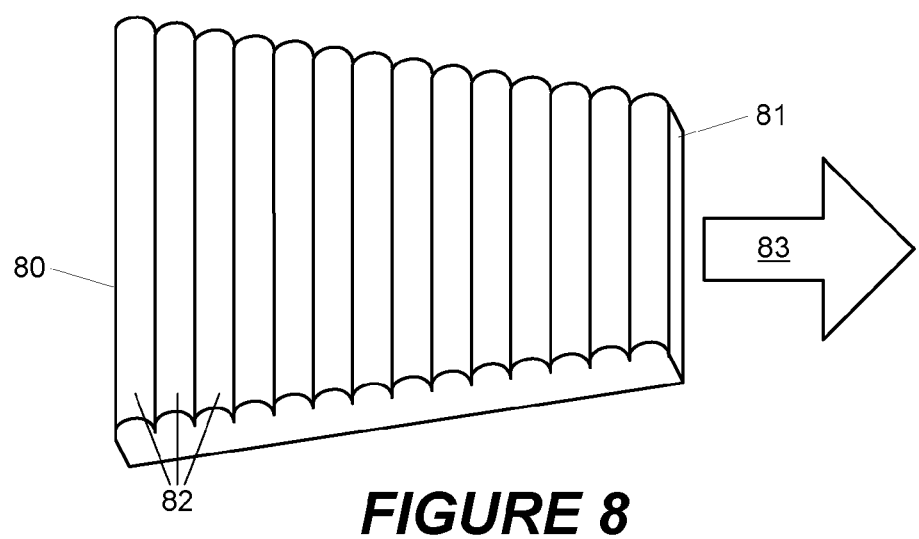
FIG. 8 is a schematic view of an external surface of an optical concentrator/diffuser according to the present invention that uses a waveguide with a tapered width.

FIG. 8 shows a waveguide concentrator embodiment for which the waveguide has a V-shape, such that a width of the waveguide is tapered, decreasing along the direction of light travel toward an exit aperture. This configuration allows the concentrator to provide a higher degree of concentration than a waveguide with a rectangular shape. Those skilled in the art will understand that it could also be designed as a compound parabolic concentrator to achieve an even better result of increased concentration from the waveguide concentrator. Cylindrical lenses 82 that are preferably patterned on the waveguide upper surface focus light on coupling structures (not shown). These coupling structures redirect light towards surface 81 in the direction indicated by the arrow 83. In the present embodiment, surface 80 is larger than surface 81. This increases the concentration of light by the waveguide.

Shown in FIG. 9 is an alternative embodiment of a concentrator in which two waveguides (each having a structure like that shown in FIG. 4, for example) both have their outputs directed to a single output location. As shown in the figure, waveguides 92 provide light collection and concentration as described above, and each have an exit aperture directed toward element 94, which may be, for example, a photovoltaic cell or a heating fluid conveyor. This arrangement allows even more concentration of optical energy on the element 94 to further increase efficiency. Those skilled in the art will understand that additional waveguide structures may also be used with their outputs facing the same element 94.

Those skilled in the art will understand that there may be different variations in the construction of the system. The waveguide may be a polymer or a glass material, and/or may be fabricated using a laminated stack of materials each having a different index of refraction. It is also possible to create a graded index material by adding an electron rich dopant to a polymer matrix, distributing quantum dots or nanoparticles in matrix material, mixing polymers with different refractive indexes or using liquid crystals. In another variation, the light extraction may take place at more than one end of the waveguide. The reflectors used in the above embodiments may also be of varied design, including convex prisms, concave prisms and gratings. Moreover, as discussed above, the asymmetric reflector design shown in FIG. 3 may be replaced with a symmetric reflector. In a concentrator embodiment, this would allow light coupled into the waveguide to be directed in two opposite direction, and to be collected at exit apertures at two opposite ends of the waveguide. In a diffuser embodiment, it would allow light coupled into the waveguide from opposite directions to be diffused and coupled out of the waveguide in the same direction. In addition, as suggested in the discussion of FIG. 9, the output of a concentrator according to the invention may be directed to different types of elements, such as a photovoltaic cell or a direct heating component, such as a liquid container that absorbs the optical energy to produce heat.

The invention claimed is:

1. An optical concentration/diffusion apparatus comprising:
 a waveguide into which light is coupled, the waveguide comprising a material having a graded index of refraction in a first direction that causes light propagating within the waveguide along a second direction different from the first direction to follow a curved path, being reflected at multiple intervals by a planar interface of the waveguide; and
 a plurality of reflectors located within the waveguide along said planar interface that receive light coupled into the waveguide and redirect it within the waveguide towards at least one exit aperture, the reflectors having a spacing along said second direction that is selected to limit interaction between the reflectors and light propagating along the second direction.

2. An apparatus according to claim 1 further comprising a plurality of optical coupling elements each of which is in optical communication with one of the reflectors.

3. An apparatus according to claim 2 wherein the light coupled into the waveguide is focused by the coupling elements onto the reflectors and redirected thereby along the second direction of the waveguide so as to provide concentration of said light at a single exit aperture.

4. An apparatus according to claim 2 wherein the light coupled into the waveguide is redirected by the reflectors toward the coupling elements that provide diffusion of said light at a plurality of exit apertures.

5. An apparatus according to claim 2 wherein the coupling elements comprise lenses.

6. An apparatus according to claim 5 wherein the lenses comprise at least one of cylindrical lenses, rotationally symmetric lenses and Fresnel lenses.

7. An apparatus according to claim 2 wherein the coupling elements comprise mirrors.

8. An apparatus according to claim 2 wherein the coupling elements are an integral part of the waveguide material.

9. An apparatus according to claim 2 wherein the coupling elements comprise surface irregularities in an interface of the waveguide that provide diffusion of light redirected by the reflectors as it exits the waveguide.

10. An apparatus according to claim 1 wherein the reflectors comprise prisms.

11. An apparatus according to claim 1 wherein the reflectors comprise diffractive optical elements.

12. An apparatus according to claim 1 wherein the waveguide has a tapered width in a direction perpendicular to the second direction.

13. An apparatus according to claim 3 wherein the apparatus is part of a solar energy concentrator.

14. An apparatus according to claim 13 further comprising a photovoltaic cell that receives solar energy exiting from the waveguide.

15. A method of optical concentration comprising:
 coupling light into a waveguide comprising a material having a graded index of refraction in a first direction that causes light propagating within the waveguide along a second direction different from the first direction to follow a curved path, said light propagating along the second direction being reflected at multiple intervals by a planar interface of the waveguide;
 receiving light coupled into the waveguide with a plurality of reflectors located within the waveguide along said planar interface that redirect the received light such that it propagates within the waveguide along said second direction, the reflectors having a spacing along said second direction that is selected to minimize interaction between the reflectors and light propagating along the second direction; and
 focusing light being coupled into the waveguide with a plurality of coupling elements each of which focuses a portion of the light onto a different one of the reflectors.

16. A method according to claim 15 wherein the coupling elements comprise at least one of lenses and mirrors.

17. A method according to claim 15 wherein the coupling elements are an integral part of the waveguide material.

18. A method according to claim 15 wherein the reflectors comprise prisms.

19. A method according to claim 15 wherein the reflectors comprise diffractive optical elements.

20. A method according to claim 15 wherein coupling light into the waveguide comprises coupling solar energy into the waveguide.

21. A method according to claim 20 further comprising receiving solar energy exiting from the waveguide with a photovoltaic cell.

22. A method of optical diffusion comprising:
 coupling light into a waveguide comprising a material having a graded index of refraction in a first direction that causes light propagating within the waveguide along a second direction different from the first direction to follow a curved path, being reflected at multiple intervals by a planar interface of the waveguide;
 receiving light propagating along the second direction within the waveguide with a plurality of reflectors located within the waveguide along said planar interface that redirect the received light along said first direction, the reflectors having a spacing along said second direction that is selected to provide a distributed interaction of the light with said plurality of reflectors; and
 dispersing light redirected by the reflectors with a plurality of dispersing elements each of which receives light from one of the reflectors and provides a dispersed output of that light from the waveguide.

23. A method according to claim 22 wherein the dispersing elements comprise at least one of lenses and mirrors.

24. A method according to claim 22 wherein the dispersing elements are an integral part of the waveguide material.

25. A method according to claim 22 wherein the reflectors comprise prisms.

26. A method according to claim 22 wherein the reflectors comprise diffractive optical elements.

* * * * *